United States Patent
Lee et al.

(10) Patent No.: US 9,543,277 B1
(45) Date of Patent: Jan. 10, 2017

(54) WAFER LEVEL PACKAGES WITH MECHANICALLY DECOUPLED FAN-IN AND FAN-OUT AREAS

(71) Applicant: Invensas Corporation, San Jose, CA (US)

(72) Inventors: Bongsub Lee, Mountain View, CA (US); Tu Tam Vu, San Jose, CA (US); Rajesh Katkar, San Jose, CA (US); Laura Wills Mirkarimi, Sunol, CA (US); Akash Agrawal, San Jose, CA (US); Kyong-Mo Bang, Fremont, CA (US); Gabriel Z. Guevara, San Jose, CA (US); Xuan Li, Santa Clara, CA (US); Long Huynh, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/830,973

(22) Filed: Aug. 20, 2015

(51) Int. Cl.
*H01L 25/065* (2006.01)
*H01L 23/00* (2006.01)
(Continued)

(52) U.S. Cl.
CPC ....... *H01L 25/0657* (2013.01); *H01L 23/3128* (2013.01); *H01L 24/03* (2013.01); *H01L 24/06* (2013.01); *H01L 24/43* (2013.01); *H01L 24/46* (2013.01); *H01L 25/50* (2013.01); *H01L 2224/04042* (2013.01); *H01L 2224/48091* (2013.01); *H01L 2224/49111* (2013.01); *H01L 2224/49112* (2013.01); *H01L 2224/49171* (2013.01)

(58) Field of Classification Search
None
See application file for complete search history.

(56) References Cited

U.S. PATENT DOCUMENTS

| 5,148,265 A | 9/1992 | Khandros et al. |
| 5,679,977 A | 10/1997 | Khandros et al. |

(Continued)

OTHER PUBLICATIONS

Sathe, Parameters affecting package thermal performance a low end system level example, May 1, 2001, pp. 1-6, http://www.electronics-cooling.com/2001/05/parameters-afecting-package-thermal-performance-a-low-end-system-level example/.

(Continued)

*Primary Examiner* — Michael Lebentritt
(74) *Attorney, Agent, or Firm* — Lerner, David, Littenberg, Krumholz & Mentlik, LLP

(57) ABSTRACT

A fan-out microelectronic package is provided in which bond wires electrically couple bond pads on a microelectronic element, e.g., a semiconductor chip which may have additional traces thereon, with contacts at a fan-out area of a dielectric element adjacent an edge surface of the chip. The bond wires mechanically decouple the microelectronic element from the fan-out area, which can make the electrical interconnections less prone to reliability issues due to effects of differential thermal expansion, such as caused by temperature excursions during initial package fabrication, bonding operations or thermal cycling. In addition, mechanical decoupling provided by the bond wires may also remedy other mechanical issues such as shock and possible delamination of package elements.

20 Claims, 7 Drawing Sheets

(51) Int. Cl.
*H01L 25/00* (2006.01)
*H01L 23/31* (2006.01)

(56) References Cited

U.S. PATENT DOCUMENTS

| | | | | |
|---|---|---|---|---|
| 6,080,605 | A * | 6/2000 | Distefano | H01L 21/565 257/E21.504 |
| 6,114,763 | A * | 9/2000 | Smith | H01L 21/563 257/692 |
| 6,486,003 | B1 * | 11/2002 | Fjelstad | H01L 23/12 257/E21.505 |
| 6,548,895 | B1 * | 4/2003 | Benavides | H01L 23/4334 137/594 |
| 6,687,842 | B1 * | 2/2004 | DiStefano | H01L 23/498 257/208 |
| 6,713,870 | B2 | 3/2004 | Fang | |
| 7,749,886 | B2 | 7/2010 | Oganesian et al. | |
| 8,119,454 | B2 | 2/2012 | Jin | |
| 8,787,032 | B2 * | 7/2014 | Haba | H01L 23/13 361/803 |
| 8,940,630 | B2 | 1/2015 | Damberg et al. | |
| 9,013,033 | B2 * | 4/2015 | Haba | H01L 23/492 257/698 |
| 2002/0068426 | A1 * | 6/2002 | Fjelstad | H01L 23/49811 438/616 |
| 2003/0062541 | A1 * | 4/2003 | Warner | H01F 17/0033 257/200 |
| 2005/0046001 | A1 * | 3/2005 | Warner | G06F 21/10 257/678 |
| 2005/0285246 | A1 * | 12/2005 | Haba | H01L 23/3128 257/678 |
| 2011/0180919 | A1 | 7/2011 | Jensen et al. | |
| 2013/0049179 | A1 * | 2/2013 | Desai | H01L 25/50 257/666 |
| 2013/0127062 | A1 * | 5/2013 | Haba | H01L 23/492 257/773 |
| 2014/0077366 | A1 * | 3/2014 | Kim | H01L 24/19 257/737 |
| 2014/0175671 | A1 * | 6/2014 | Haba | H01L 23/528 257/777 |
| 2015/0014847 | A1 * | 1/2015 | Mohammed | H01L 23/49811 257/737 |
| 2015/0091118 | A1 * | 4/2015 | Sato | H01L 23/13 257/432 |

OTHER PUBLICATIONS

Open Cavity QFN Package, Global Semiconductor Packaging Materials Exchange and Resources Center, copyright 2010.

Gao, Guilian, et al, Compliant Wafer Level Package for Enhanced Reliability, Tessera, Inc., 2007.

Schueller, R.D., et al., Performance and Reliability of a Cavity Down Tape BGA Package, 3M Electronic Products Division, Oct. 1997.

* cited by examiner

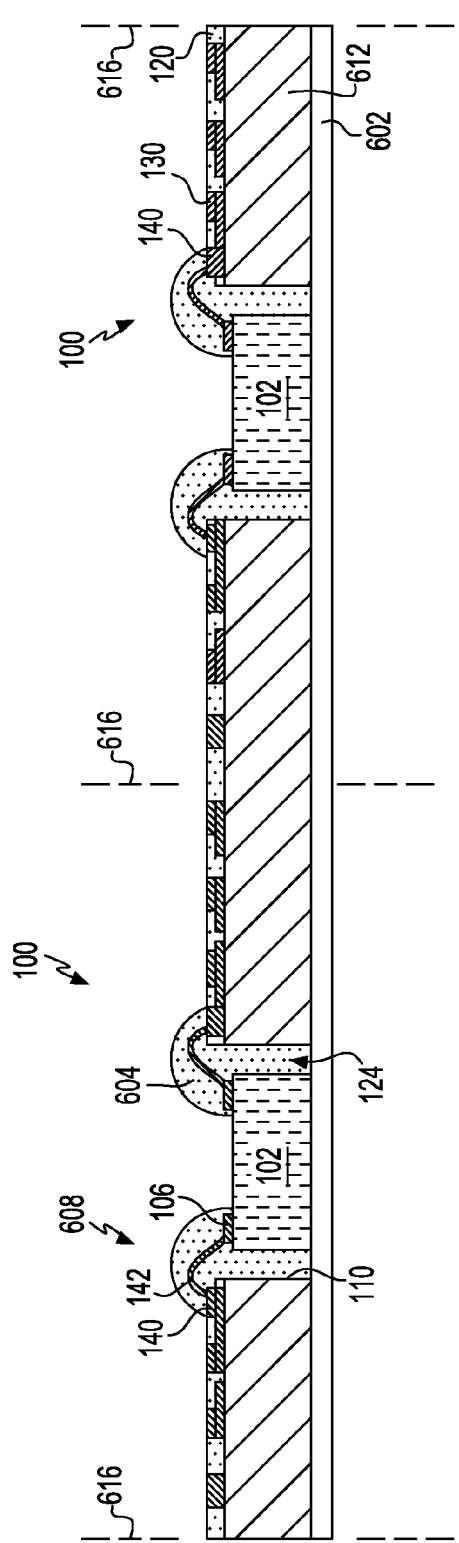
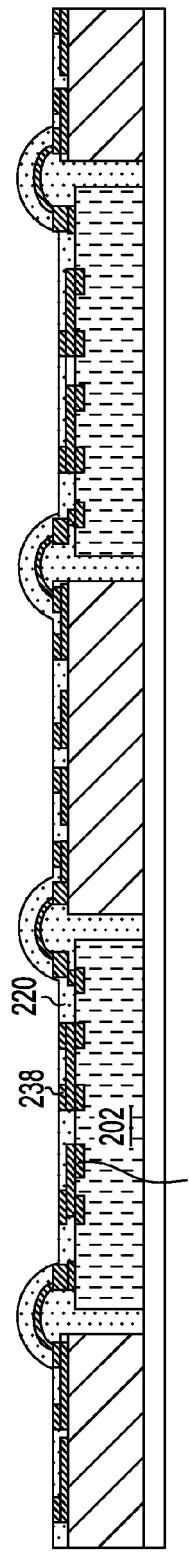
FIG. 14A
FIG. 14B

WAFER LEVEL PACKAGES WITH MECHANICALLY DECOUPLED FAN-IN AND FAN-OUT AREAS

BACKGROUND OF THE INVENTION

Field of the Invention

This application relates to fan-out microelectronic packages such as commonly known as fan-out wafer-level packages and methods of fabrication therefor.

Description of the Related Art

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In some designs which are referred to as "flip chip" designs, the front face of the chip confronts the face of a package substrate, i.e., chip carrier and the contacts on the chip are bonded directly to contacts of the chip carrier by solder balls or other connecting elements. In turn, the chip carrier can be bonded to a circuit panel through terminals overlying the front face of the chip.

There are, however, applications in which a relatively larger package is desired. These include instances in which a relatively large fan-out area is needed to achieve connection to a larger array on a printed circuit board or the like. Many wafer-level packages present reliability issues in such relatively larger sizes due to an inherent increase in the effects of varying coefficients of thermal expansion among the components of the package. Such effects can also be visible in relatively smaller applications, particularly when contacts are placed in certain locations and when the package undergoes frequent heat-cycling.

Accordingly, further improvements would be desirable in the area of wafer-level packages or similar structures.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

Semiconductor chips are commonly packaged in single- or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

As manufacturers of smartphones, tablets and other devices constantly seek increased performance and greater circuit density the trend for these devices is to provide ever greater functional capabilities in an amount of space on a circuit panel that may stay the same or decrease over time. In light of the foregoing, certain improvements can be made in the structure of microelectronic packages and assemblies which comprise a microelectronic package.

SUMMARY OF THE INVENTION

A fan-out microelectronic package according to an aspect of the invention can include a microelectronic element which has a face defining a plane, a plurality of bond pads at the face, and a plurality of edge surfaces each extending in a direction transverse to the plane. A dielectric element of the package may include a monolithic dielectric region of molded dielectric material or glass, the dielectric element having one or more edge surfaces each juxtaposed with or contacting a corresponding edge surface of the microelectronic element. A plurality of terminals and contacts can be disposed at a major surface of the dielectric element overlying the monolithic dielectric region, each terminal configured to connect with a component external to the package, the terminals being coupled with the contacts through traces supported on the dielectric element. A plurality of bond wires of extruded metal wire may each have a first end joined with a bond pad and a second end joined with a contact of and may cross over corresponding edge surfaces of the microelectronic element and the dielectric element, such that at least some of the terminals are electrically coupled with at least some of the bond pads through the bond wires.

In one or more embodiments, the microelectronic element may comprise first and second microelectronic elements, wherein surfaces of the bond pads of the first and second microelectronic elements to which the bond wires are joined are co-planar with the respective contacts within a tolerance of fifty microns.

In one or more embodiments, the microelectronic element may comprise a first semiconductor chip and a second semiconductor chip stacked atop the first semiconductor chip, wherein the bond pads to which the bond wires are joined are disposed atop at least one of the first and second semiconductor chips.

In one or more embodiments, the dielectric element may further include at least one dielectric layer deposited atop the monolithic dielectric region, wherein at least one of the contacts, the terminals or the traces are supported by the one or more deposited dielectric layers.

In one or more embodiments, the dielectric element may comprise a molded region contacting the at least one edge surface of the microelectronic element.

In one or more embodiments, the dielectric element may have at least one edge surface confronting the at least one edge surface of the microelectronic element with a gap between the at least one edge surface of the dielectric element and the at least one edge surface of the microelectronic element, wherein at least some of the bond wires cross over the gap.

In one or more embodiments, the microelectronic package may comprise collapsible electrical connection elements provided atop the terminals, wherein a minimum height of the collapsible electrical connection elements in the collapsed state above the major surface is greater than a maximum loop height of the bond wires above the major surface.

In one or more embodiments, the microelectronic element may comprise a semiconductor chip having a surface, a plurality of chip contacts at the surface of the semiconductor chip, and a dielectric layer deposited on the surface of the semiconductor chip, wherein at least some of the bond pads are electrically coupled with the chip contacts through traces supported by the dielectric layer.

In one or more embodiments, the microelectronic package may comprise second terminals at the face of the microelectronic element and supported by the dielectric layer, the second terminals configured to connect with at least one component external to the microelectronic package, at least some of the second terminals electrically coupled with the chip contacts.

In one or more embodiments, the microelectronic element may comprise a semiconductor chip having a surface, a plurality of chip contacts at the surface of the semiconductor chip, a dielectric layer deposited on the surface of the semiconductor chip, and traces supported by the dielectric layer extending from the chip contacts. In such one or more embodiments, the microelectronic package may further comprise second terminals at the face of the microelectronic element, with at least some of the second terminals electrically coupled with the chip contacts through the traces.

A fan-out microelectronic package in accordance with an aspect of the invention can comprise a microelectronic element having a front face defining a plane, a rear face opposite the front face, a plurality of bond pads at the front face, and a plurality of edge surfaces each extending in a direction transverse to the plane. The rear face of the microelectronic element can be exposed at an exterior of the microelectronic package. In accordance with such aspect of the invention, a dielectric element of the package can have one or more edge surfaces each juxtaposed with or contacting a corresponding edge surface of the microelectronic element. A plurality of terminals and a plurality of contacts may be disposed at a major surface of the dielectric element electrically coupled with the terminals through traces supported on the dielectric element, the terminals configured to connect with a component external to the package. A plurality of bond wires of extruded metal wire may each have a first end joined with a bond pad of the plurality of bond pads and a second end joined with a contact of the plurality of contacts and crossing over the corresponding edge surfaces of the microelectronic element and the dielectric element. At least some of the terminals may be electrically coupled with at least some of the bond pads through the bond wires.

In one or more embodiments, the terminals may comprise substantially rigid metal posts, wherein a minimum height of the metal posts above the major surface is greater than a maximum loop height of the bond wires above the major surface.

A method of making a fan-out microelectronic package in accordance with an aspect of the invention can comprise: forming a plurality of bond wires of extruded metal wire each joined to a bond pad at a face of a microelectronic element and to a contact at a major surface of a dielectric element. The microelectronic element and the dielectric element may be positioned relative to one another such that an edge surface of the dielectric element is juxtaposed with a corresponding edge surface of the microelectronic element with a gap between the juxtaposed edge surfaces, each bond wire extending across the juxtaposed edge surfaces of the microelectronic element and the dielectric element. A plurality of terminals at the major surface of the dielectric element may be electrically coupled with the contacts and configured to connect with a component external to the package. At least some of the terminals are electrically coupled with the bond pads through the contacts and the bond wires, and the dielectric element may include a monolithic dielectric region of molded dielectric material or glass, with the plurality of terminals and contacts overlying the monolithic dielectric region.

In one or more embodiments, the dielectric element may include the monolithic dielectric region and a dielectric layer overlying the monolithic dielectric region, and the method may further comprise depositing the dielectric layer onto the monolithic dielectric region and then forming at least one of: at least some contacts or at least some terminals supported by the dielectric layer.

In one or more embodiments, the microelectronic element may include a semiconductor chip having a surface, a plurality of chip contacts at the surface, and a dielectric layer overlying the surface of the semiconductor chip. In such one or more embodiments, the method may further comprise, prior to forming the bond wires, depositing the dielectric layer onto the surface of the semiconductor chip and then forming at least one of: at least some bond pads supported by the dielectric layer, or at least some traces supported by the dielectric layer, the at least some bond pads electrically coupled to the chip contacts through the traces.

In one or more embodiments, the microelectronic element may comprise a semiconductor chip having a surface and a plurality of chip contacts at the surface of the chip, wherein the bond pads are electrically coupled with the contacts of the chip through metalized vias extending from the chip contacts, and traces extending from the metalized vias in a direction parallel to the surface of the semiconductor chip.

A method of making a fan-out microelectronic package in accordance with an aspect of the invention may comprise: introducing a flowable dielectric material into a cavity of a mold in which a microelectronic element is disposed to form a molded region contacting at least one edge surface of the microelectronic element; forming a plurality of electrically conductive contacts and electrically conductive terminals overlying a surface of the molded region; forming a plurality of bond wires of extruded wire each joined with a bond pad of a plurality of bond pads at a face of the microelectronic element, and each bond wire joined with a contact of the plurality of contacts, the terminals being configured to connect with a component external to the microelectronic package, and the terminals electrically coupled with the bond pads through the contacts and the bond wires.

In one or more embodiments, the forming electrically conductive terminals and electrically conductive contacts can comprise depositing at least one dielectric layer overlying the surface of the molded region, and depositing an electrically conductive material onto the at least one dielectric layer.

In one or more embodiments, the terminals are first terminals, and the method may further comprise forming second terminals at the face of the microelectronic element, the second terminals configured to connect with at least one component external to the microelectronic package, the second terminals electrically coupled with the bond pads.

In one or more embodiments, surfaces of the bond pads to which the bond wires are joined are co-planar within a tolerance of fifty microns with surfaces of the contacts to which the bond wires are joined.

BRIEF DESCRIPTION OF THE DRAWINGS

FIG. 14A illustrates a stage in fabrication of a microelectronic package in accordance with an embodiment of the invention.

FIG. 14B illustrates a stage in fabrication of a microelectronic package in accordance with an embodiment of the invention.

DETAILED DESCRIPTION

Figure 1B:
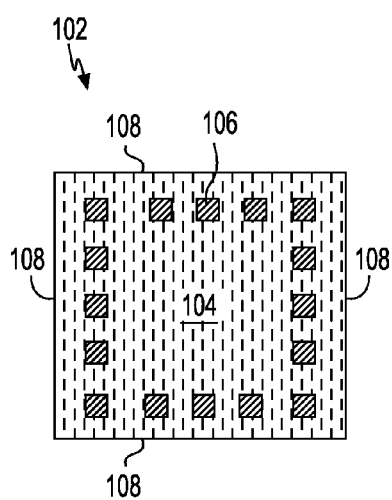
FIG. 1B is a top-down plan view illustrating a microelectronic element incorporated in a fan-out microelectronic package in accordance with an embodiment of the invention.
Figure 1C:
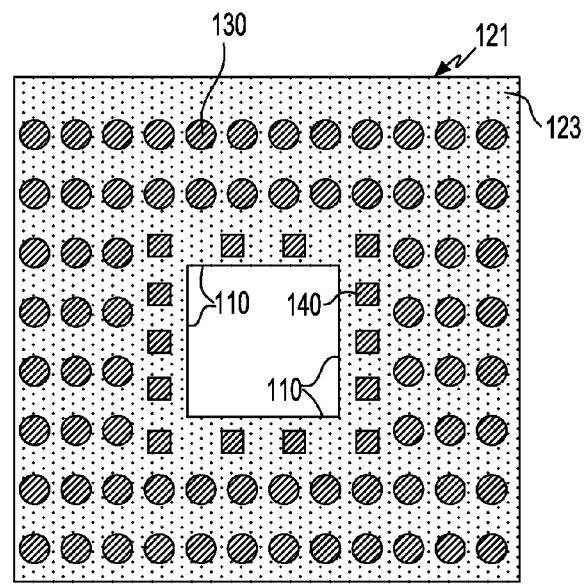
FIG. 1C is a top-down plan view illustrating a molded region and associate structure in a fan-out microelectronic package in accordance with an embodiment of the invention.
Figure 1A:
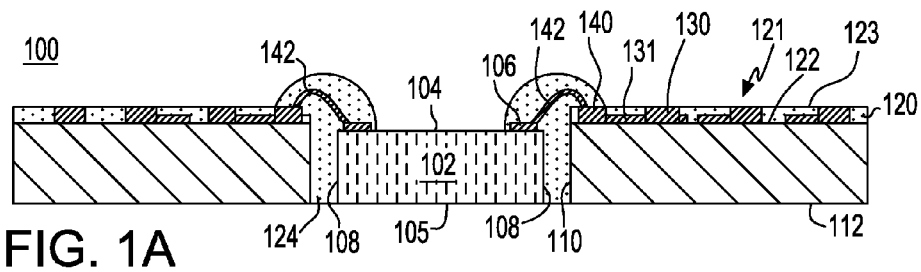
FIG. 1A is a sectional view illustrating a fan-out microelectronic package in accordance with an embodiment of the invention.

Referring to FIGS. 1A-1C, a fan-out microelectronic package 100 is provided in accordance with an embodiment of the invention. As seen in FIG. 1A, the package 100 includes a microelectronic element 102 having a front face 104, a plurality of bond pads 106 at the front face 104, and a rear face 105 opposite the front face. In an example as seen in FIG. 1A, the microelectronic element 102 is a bare semiconductor chip wherein a surface of the bare semiconductor chip is the face 104 of the microelectronic element, and the bond pads 106 are disposed at a surface of the semiconductor chip. As used in this disclosure with reference to a component, e.g., an interposer, microelectronic element, circuit panel, substrate, etc., a statement that an electrically conductive element is "at" a surface or face of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate.

Similarly, as used herein, a statement that an electrically conductive element is "at" a surface of a region or a layer of a component such as a dielectric region, dielectric layer or electrically insulating layer indicates that, when the surface of the layer is exposed, and not assembled or covered by any other element or layer, the electrically conductive element is available for contact with a theoretical point moving in a direction perpendicular to the surface of the region or layer toward the surface of the region or layer from outside the region or layer. Thus, a terminal or other conductive element which is at a surface of a layer may project from such surface; may be flush with such surface; or may be recessed relative to such surface in a hole or depression extending downwardly from the surface.

As further seen in FIG. 1B, the microelectronic element 102 has a plurality of edge surfaces 108 each extending in a direction transverse to, i.e., at angle to or perpendicular to a plane defined by the front face 104. The microelectronic element comprises a plurality of active devices, e.g., devices having an amplification function which are configured to amplify signals and/or devices configured to switch a large number of cycles between two or more states.

The microelectronic package 100 includes a dielectric element 121 having a major surface 123 at which terminals 130 and contacts 140 are provided, the terminals electrically coupled with the contacts such as through traces 131. Each terminal overlies at least a portion of the dielectric element 121. An edge surface 110 of the dielectric element which extends in a direction transverse to the major surface is juxtaposed with an edge surface 108 of the microelectronic element 102. Terminals 130 overlie at least a portion of the dielectric element and are configured to connect with a component external to the microelectronic package, such as through a set of joining elements, such as joining elements 132 illustrated above terminals 130 in FIG. 2. As seen in FIG. 1A, the rear face 105 may be exposed at an exterior of the microelectronic package 100. In one example, the exposed rear face 105 may be co-planar with a bottom surface of a monolithic dielectric region 112 comprised by the dielectric element.

The monolithic dielectric region is a region of dielectric material having essentially the same composition throughout the region. In one embodiment, the dielectric element comprises a monolithic dielectric region 112 which can be realized using a glass or ceramic dielectric element. In a particular example, the monolithic dielectric region can formed of a polymeric material which may have thermoplastic or thermoset properties. In a particular example, such polymeric material may be combined with a dielectric or semiconducting filler material to provide the monolithic dielectric region. In one example, a dielectric element can include a polymeric region, which may or may not incorporate a dielectric or semiconducting filler material. In any of the above examples, such dielectric element can be a molded polymeric region, which in some cases may have a particulate composite construction which includes a polymeric matrix and particulate loading within the polymeric matrix. Such composite layer can be formed, for example, by introducing a flowable dielectric material of uncured polymeric material, such as an overmold material or potting compound, which has the particulate loading material therein into a cavity of a mold, the particulate loading material optionally being a dielectric or semiconductor material having a low coefficient of thermal expansion ("CTE"). The filler may include particles of dielectric or semiconductor material such as alumina, ceria, glass, silicon, among others.

In some cases, the filler material can increase the stiffness and/or reduce the coefficient of thermal expansion ("CTE") of the molded region as compared to a molded region containing only the polymeric component. For example, a dielectric region 112 may have a CTE of less than 20 parts per million per degree Celsius (hereinafter, "ppm/° C."), or less than 12 ppm/° C., or less than 10 ppm/° C., or less than 8 ppm/° C.

Figure 3:
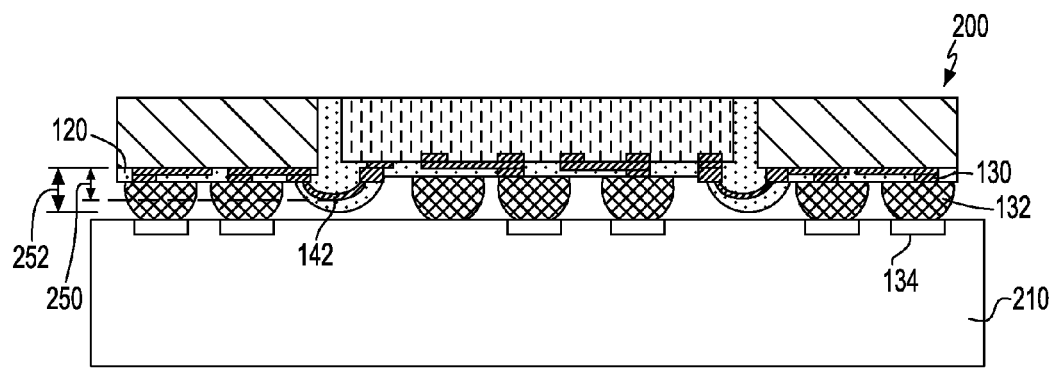
FIG. 3 is a sectional view further illustrating a fan-out microelectronic package in accordance with a variation of the embodiment of the invention, as further electrically coupled with a circuit panel.

As further seen in FIG. 1A, the dielectric element may include a dielectric layer 120 overlying the monolithic region. In some cases, the dielectric layer 120 is deposited on a surface of a monolithic dielectric region or molded region 112. The dielectric layer may support a plurality of terminals 130 and contacts 140 at a major surface 123 of the dielectric element and which overlie the monolithic dielectric region. The terminals are configured to connect with a component external to the microelectronic package. For example, as seen in FIG. 3, a microelectronic package 200 can have a plurality of terminals 130 joined to component contacts 134 of an external component such as a circuit panel 210.

A plurality of bond wires 142 are joined with the bond pads 106 of the microelectronic element 102 and the contacts 140 so as to cross over the juxtaposed edge surfaces 108 and 110. Bond wires are formed from extruded metal wire, typically gold, copper, copper alloy, or other metal which may or may not have a cladding thereon, the wire typically having a diameter from five to 100 microns. The wire bonds are formed, for example, using a bonding tool of capillary or wedge-bonding type which applies heat and/or pressure to bond a portion of the wire adjacent a surface of a capillary or wedge-bonding tool to one of the contact or a bond pad, and then using heat and/or pressure to bond the wire at another point on the wire to the other one of the contact or a bond pad. Thereafter, the tool typically severs the bonded portion of the wire from a remaining portion of the wire which extends within the bonding tool. In this way, bond pads 106 of the microelectronic element are electrically coupled with the contacts 140. In addition, the terminals 130 are electrically coupled with the bond pads of the microelectronic element through the electrically conductive structure, e.g., traces, metalized vias, etc., with the contacts 140 and the bond pads 106. As further seen in FIG. 1, surfaces of the contacts and the bond pads to which the bond wires 142 are joined can be co-planar within a tolerance of fifty microns in a direction above or below a height of the face 104 of the microelectronic element 102, "micron" being a unit of measure equal to a micrometer.

As further seen in FIG. 1A, the dielectric region 112 may have an edge surface 110 confronting an edge surface 108 of the microelectronic element with a gap 124 between the at least one edge surface 110 of the dielectric element and the at least one edge surface 108 of the microelectronic element, wherein at least some of the bond wires 142 cross over the gap.

As seen in FIG. 1A, the microelectronic package can be fabricated such that surfaces of the bond pads 106 and the contacts 140 to which the bond wires 142 are joined at either end are co-planar within a tolerance. In one example, the microelectronic element and the dielectric element can be assembled with one another such that surfaces of the contacts and the surface of the corresponding bond pads 106 to which the bond wires are joined are co-planar within a tolerance of fifty microns. In one example, the surfaces of the contacts and the surfaces of the corresponding bond pads can be co-planar within a tolerance of 30 microns. In another example, the surfaces of the contacts and the surfaces of the corresponding bond pads can be co-planar within a tolerance of 10 microns.

In the microelectronic package 100, the bond wires 142 mechanically decouple the microelectronic element 102 from the fan-out area overlying the molded region 112, which can make the electrical interconnections therebetween less prone to reliability issues. For example, the bond wires can be less susceptible to effects of differential thermal expansion than traces that extend from areas overlying the microelectronic element to the fan-out molded region because bond wires are flexible and typically have slack such that the bond wires can bend and flex in response to forces exerted thereon. Thus, the bond wires 142 can be less susceptible to reliability concerns than traces which extend across a boundary between the microelectronic element and the molded region, in response to temperature excursions during initial package fabrication, bonding operations or thermal cycling, among others. In addition, the mechanical decoupling provided by the bond wires may also remedy other mechanical issues such as shock and possible delamination of package elements which would also impact such traces in a more severe way. In this way, embodiments of the invention described herein can provide an improvement over packages which have traces extending from areas overlying the microelectronic element to the fan-out molded region.

Figure 2:
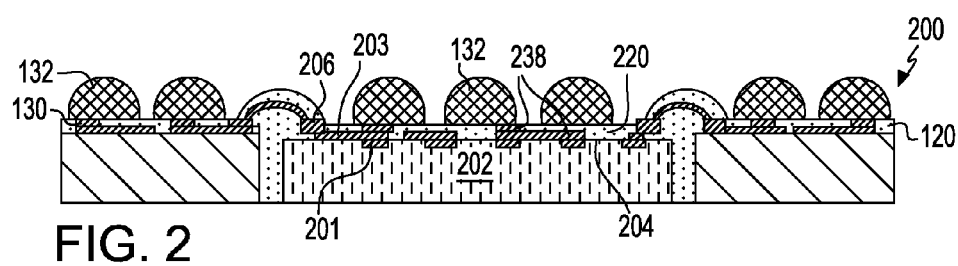
FIG. 2 is a sectional view illustrating a fan-out microelectronic package in accordance with a variation of the embodiment of the invention seen in FIGS. 1A-1C.

FIG. 2 illustrates a microelectronic package according to a variation of the embodiment seen in FIGS. 1A-1C in which the microelectronic element comprises a semiconductor chip having a plurality of chip contacts 201 at a face of the semiconductor chip, the chip contacts being electrically coupled to circuitry within the semiconductor chip. Bond pads 206 are electrically coupled with the chip contacts 201 through electrically conductive structure which may include traces 203 extending in one or more directions parallel to the face 204 of the semiconductor chip 202. In one example, a dielectric layer 220 can be deposited on a surface of the semiconductor chip of the microelectronic element, and the traces 203 and/or the bond pads 206 can be supported by the dielectric layer. In such example, the bond pads 206 can be disposed at positions which are displaced from the chip contacts in one or more lateral directions parallel to the face of the semiconductor chip. In addition, as in the above-discussed example (FIGS. 1A-1C), the microelectronic element and the dielectric element can be assembled with one another such that surfaces of the contacts and the surface of the corresponding bond pads 206 to which the bond wires are joined are co-planar within a tolerance of fifty microns. In one example, the surfaces of the contacts and the surfaces of the corresponding bond pads can be co-planar within a tolerance of 30 microns. In another example, the surfaces of the contacts and the surfaces of the corresponding bond pads can be co-planar within a tolerance of 10 microns.

As also seen in FIG. 2, additional terminals 238, e.g., "second terminals" can overlie the face of the semiconductor chip 202 for connection with a component external to the microelectronic package, such as described above relative to FIG. 1. In this way, bond pads and/or second terminals may be disposed at positions displaced from the chip contacts 201 in one or more of the lateral directions parallel to the face 204 of the semiconductor chip. In some cases, the second terminals 238 at a surface of a microelectronic element can be electrically coupled with chip contacts 201 at a surface of a semiconductor chip incorporated in the microelectronic element. In other cases, second terminals 238 at a surface of a microelectronic element are not electrically coupled with chip contacts of the semiconductor chip incorporated in the microelectronic element. For example, one or more second terminals on a microelectronic element can be electrically coupled within circuitry on the dielectric element 121 without having an electrical connection to such semiconductor chip.

As further seen in FIG. 2, collapsible electrical connection elements 132 can be provided atop the terminals 130. such as for use in joining the microelectronic package with an external component through the terminals as described above. Thus, in one example, the collapsible electrical connection elements 132 may include an electrically conductive bonding material or bond metal configured for attachment between the terminals and corresponding contacts of one or more external components to be electrically connected to the terminals 130. In a specific example as seen in FIG. 2, the collapsible electrical connection elements can additionally be provided atop the terminals 238 at a face of the microelectronic element.

As further seen in FIG. 3, a minimum height 252 of the collapsible electrical connection elements 132 in the collapsed state above a top surface of the dielectric layer 120 is greater than a maximum loop height 250 of the bond wires 142 above the surface of the dielectric layer. For example, the maximum loop height 250 of the bond wires 142 can be approximately 100 microns or less and the minimum height 252 of the connection elements 132 in the collapsed (joined) state can be 150 microns or more typically for ball grid array ("BGA") type connection elements. In particular examples, the maximum loop height may be even less, such as 60 microns. Alternatively, or in addition thereto, the connection elements may have greater height than 150 microns in the collapsed state.

In a particular embodiment, referring to FIG. 2, the dielectric layers 120, 220 may be made of a compliant material and may have compliant properties. For example, the compliant material can be a material having a Young's modulus of less than 4.5 Gigapascals ("GPa"), which can include materials such as polyimide, silicone, among others.

With compliant dielectric layers 120, 220 the terminals 130, 238 can be relatively mechanically decoupled from the molded region and the microelectronic element from which they are separated by the dielectric layers. In this way, the terminals 130, 238 can shift in position in a direction parallel to such compliant layer by forces applied to the terminals 130, 238 through their connections with the contacts 134 of the external component, so as to accommodate differential thermal expansion between the external component and the microelectronic element and molded region.

In a particular embodiment, the terminals 130 or 238 or both 130 and 238 can comprise substantially rigid metal posts, such as posts formed of copper or copper alloy by plating within an opening or etching a sheet-like element to form the posts. In such case, a minimum height of the metal posts above the surface of the dielectric layer is greater than a maximum loop height of the bond wires above the surface of the dielectric layer.

Figure 4:
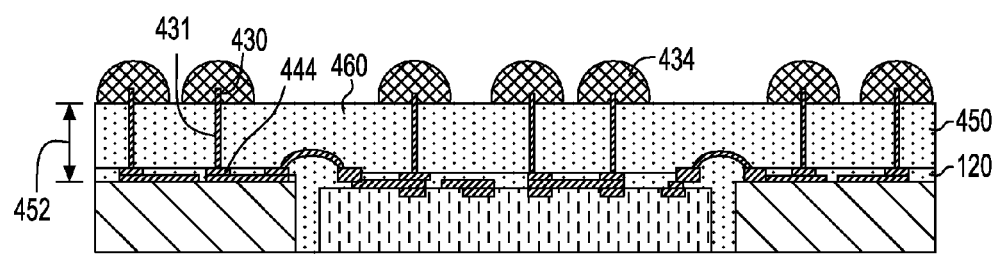
FIG. 4 is a sectional view illustrating a fan-out microelectronic package in accordance with a variation of the embodiment of the invention seen in FIGS. 1A-1C.

FIG. 4 illustrates a further variation in which the dielectric element may include a second dielectric layer 450 overlying the first dielectric layer 120. The second dielectric layer can comprise an encapsulant material, e.g., an overmold, or may comprise a compliant material such as described above. As seen in FIG. 4, a plurality of electrical conductors 431 extend within the second dielectric layer 450 to a height 452 of at least 50 micrometers above the surface of a monolithic dielectric region of the dielectric element to terminals 430 at a surface 460 of the second dielectric layer 450. In some cases, the electrical conductors 431 can be formed of extruded wire, e.g., gold or copper wires, which in some cases may include a cladding. In such case, the electrical conductors 431 can be formed by forming wire bonds which extend from pads 444 at a surface of the first dielectric layer, the wire bonds when fully formed having free ends 430 at a surface 460 of the second dielectric layer. In particular examples, the wire bonds can be formed by a process such as described, for example, in commonly-owned U.S. Pat. No. 8,940,630, the disclosure of which is incorporated herein by reference. In some cases, the free ends 430 of the electrical conductors, e.g., wire bonds, can function as the terminals of the microelectronic package. Collapsible electrical connection elements 434 such as masses of bonding material or a bond metal can be attached to the terminals as in the above-described embodiment, either directly, or through a barrier metal layer which may be provided in contact with or overlying surfaces of the wire bonds.

Figure 5:
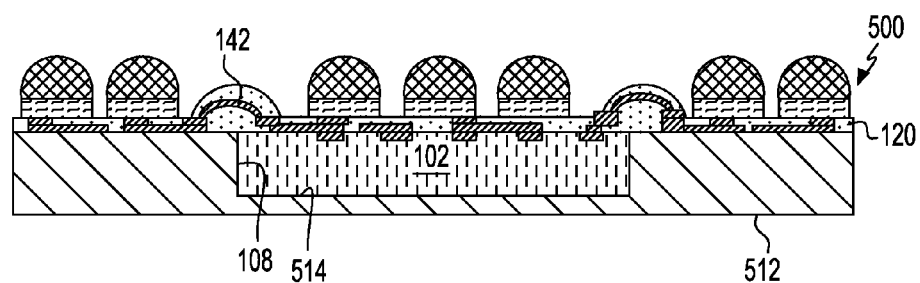
FIG. 5 is a sectional view illustrating a fan-out microelectronic package in accordance with a variation of the embodiment of the invention seen in FIGS. 1A-1C.
Figure 6A:
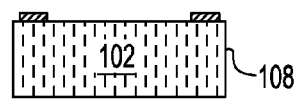
FIG. 6A is a sectional view and FIG. 6B is a corresponding top-down plan view illustrating a microelectronic element in a stage in fabrication of a microelectronic package in accordance with an embodiment of the invention.
Figure 7A:
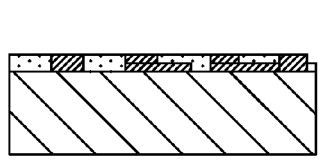
FIG. 7A is a sectional view and FIG. 7B is a corresponding top-down plan view illustrating a molded region in a stage in fabrication of a microelectronic package in accordance with an embodiment of the invention.
Figure 7A:
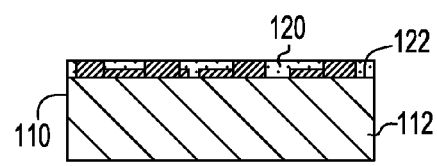
Figure 8:
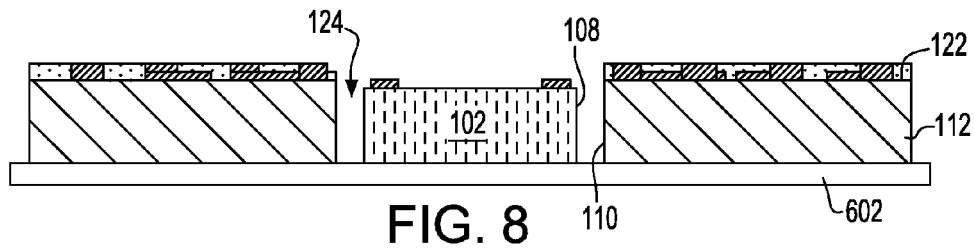
FIG. 8 illustrates a stage in fabrication of a microelectronic package in accordance with an embodiment of the invention.

FIG. 5 illustrates a variation of the above-described embodiments wherein, instead of a dielectric element and the microelectronic element having edge surfaces spaced apart from one another, a dielectric element can instead be provided which includes a molded region 512 formed on the edge surfaces 108 of the microelectronic element 102. The molded region 512 can be formed in contact with or overlying a rear surface 514 of the microelectronic element 102 so as to form an integral molded unit which incorporates the microelectronic element 102 molded into it. Thereafter, a dielectric layer 120, terminals, contacts and bond wires 142 can be formed, and masses of electrically conductive bond material or bond metal can be provided at surfaces of the terminals as described above.

As further illustrated in FIGS. 6A-10, a method of fabricating a microelectronic package will now be described. A microelectronic element 102 (FIGS. 6A-6B) having edge surfaces 108 can be positioned relative to a dielectric element (FIGS. 7A-7B) such as described above, wherein the dielectric element may comprise a monolithic dielectric region 112 upon which a relatively thin dielectric layer 120 is deposited or otherwise provided. The microelectronic element 102 and dielectric element are positioned on a temporary carrier 602 (FIG. 8) such as a temporary adhesive structure or tape. In this way, an edge surface 110 of the dielectric element is juxtaposed with a corresponding edge surface 108 of the microelectronic element with a gap 124 between the juxtaposed edge surfaces, wherein the edge surface 110 of the dielectric element extends in a direction away from a major surface 122 of a monolithic dielectric region of the dielectric element.

Figure 9:
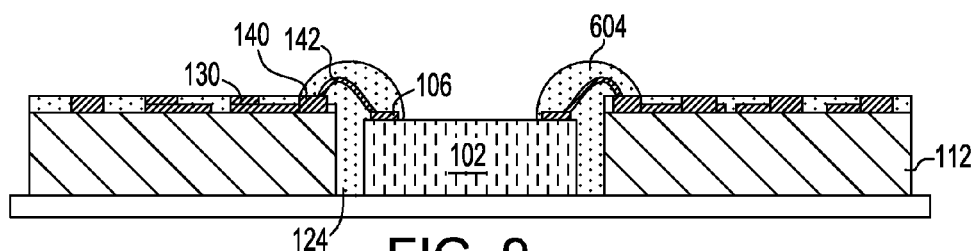
FIG. 9 illustrates a stage in fabrication of a microelectronic package in accordance with an embodiment of the invention.

Thereafter, as seen in FIG. 9, a plurality of bond wires 142 of extruded metal wire can be formed joined to bond pads 106 at the face of the microelectronic element and the contacts 140 overlying the dielectric region 112. The bond wires 142 cross over the gap 124 between the juxtaposed edge surfaces of the microelectronic element 102 and the dielectric region 112. In this way, terminals 130 overlying the dielectric region 112 which are electrically coupled with the contacts 140 can be electrically coupled with the bond pads 106 through the bond wires 142. An encapsulant 604 can then be provided overlying the bond wires 142 and extending within the gap 124 between the juxtaposed edge surfaces.

Figure 10:
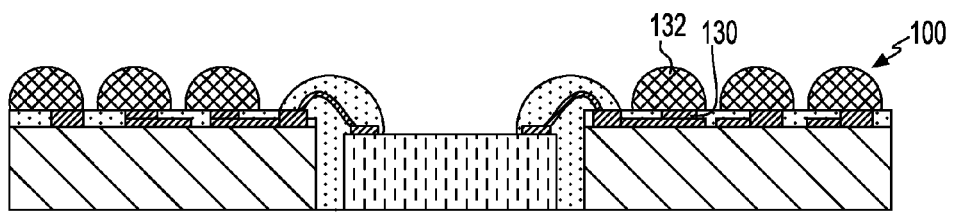
FIG. 10 illustrates a stage in fabrication of a microelectronic package in accordance with an embodiment of the invention.
Figure 6B:
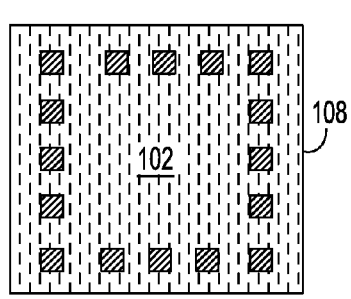
Figure 7B:
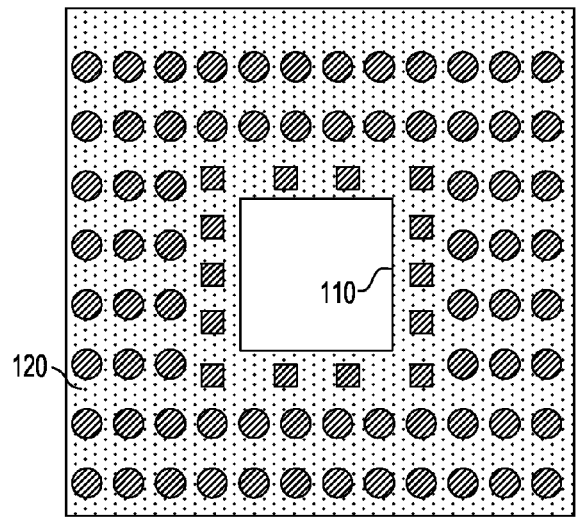

Thereafter, as further seen in FIG. 10, collapsible electrical connection elements 132 can be attached to the terminals 130 overlying the dielectric element. The temporary carrier may then be removed, such that the microelectronic package 100 appears as shown in FIG. 10, and may have features such as described above relative to FIGS. 1A-B, 2 and/or 3. Alternatively, the carrier 602 (FIG. 8) may be a permanent support element of the assembly which remains in place after the fabrication steps described above.

Figure 11:
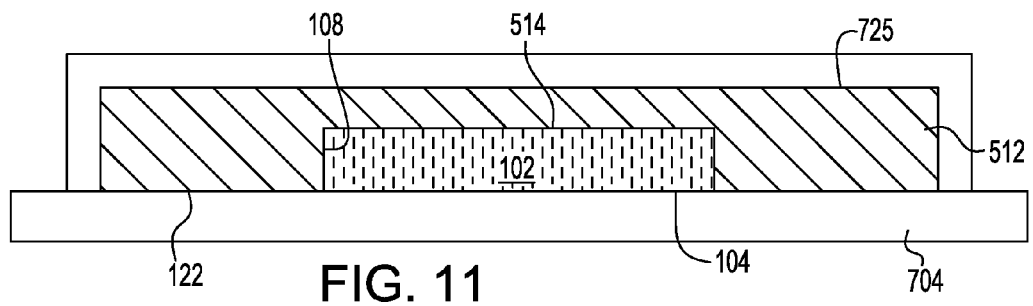
FIGS. 11-13 illustrate stages in fabrication of a microelectronic package in accordance with a variation of the embodiment of the invention in FIGS. 6A-10.
Figure 12:
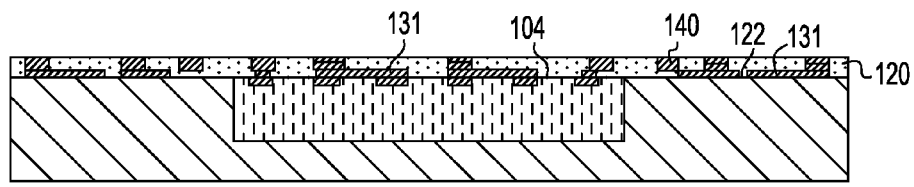
Figure 13:
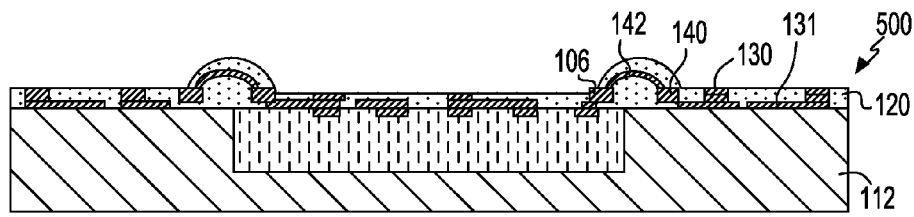

As further seen in FIGS. 11, 12, 13, a method will now be described for fabricating a microelectronic package 500, such as that described in the foregoing with respect to FIG. 5. As depicted in FIG. 11, a microelectronic element 102 is disposed on a temporary carrier 704 such that a contact-bearing face 104 of the microelectronic element 102 faces toward and may contact the temporary carrier 704, optionally through a temporary adhesive. A mold plate having an internal cavity 725 sized to accommodate the microelectronic element 102 may then be brought into a position covering the rear surface 514 and edge surfaces 108 of the microelectronic element 102. In certain implementations, such as shown in FIGS. 11-13, the internal cavity may be larger in all dimensions to allow mold material on the rear surface 514. A flowable, e.g., liquid, material can then be introduced into the cavity of the mold in which a microelectronic element is disposed to form a molded region 512 contacting at least an edge surface 108 of the microelectronic element. In one example, the flowable material is an encapsulant. Thereafter, as seen in FIG. 12, the mold plate and the temporary carrier can be removed after partially or fully curing the flowable material, wherein a face 104 of the microelectronic element 102 at which bond pads are disposed faces in a same direction as a major surface 122 of the molded region.

One or more dielectric layers 120 can then optionally be deposited atop the major surface of the molded region. At a surface of the one or more dielectric layers, or at a surface of the molded region, a plurality of contacts 140 are formed and traces 131 are formed which may be supported by the one or more dielectric layers 120 or the major surface 122 of the molded region. The contacts and traces can be formed by depositing an electrically conductive material onto a surface 122 of the molded region or onto a surface of a dielectric layer 120 overlying the molded region.

As further seen in FIG. 13, a plurality of bond wires 142 are formed which electrically couple a bond pad 106 at a face of the microelectronic element with a contact 140 at a surface of dielectric layer 120. A plurality of terminals 130 can be disposed at a major surface of the dielectric element, the terminals at or overlying the major surface 122 of the molded region, and the terminals 130 being configured to connect with a component external to the microelectronic package. The terminals 130 are electrically coupled with the contacts 140 through electrically conductive structure such as traces 131 and/or metalized vias, for example. FIG. 13 illustrates a microelectronic package 500 formed thereby.

In addition, in a particular embodiment, the thickness of the microelectronic elements and/or the thickness of the molded region in a direction orthogonal to the face and major surface thereof as shown in FIG. 11 can be reduced after forming the molded region 512. In this way, possible warpage issues can be addressed, while also providing a thinner microelectronic package.

In another variation of the above embodiment, one or more of a dielectric layer 120 (see FIG. 1A, for example) overlying the dielectric element or a dielectric layer 220 of a microelectronic element (see FIG. 2 or FIG. 5, for example) can be a compliant layer. For example, a compliant layer formed of a dielectric material which is intrinsically compliant as having a Young's modulus of less than 4.5 GPa can be formed atop the major surface 104 of a molded region or monolithic dielectric region of dielectric element, and/or formed atop a semiconductor chip, and the contacts, terminals, etc., can then be formed on or above such compliant layer. In another example, a relatively thick dielectric layer having a Young's modulus higher than 4.5 GPa can be used, and then the dielectric layer can be made compliant by patterning the layer to form openings, gaps, etc., e.g., a set of intersecting gaps which extend over the area of the dielectric layer, at a spacing which is sufficiently small to allow each portion of the dielectric layer which remains to be relatively or fully mechanically isolated from other portions of the dielectric layer from which it is separated by the gaps. In yet another variation of the embodiment shown in FIGS. 1A-1C, a compliant layer can be formed on a surface 122 of a molded or monolithic dielectric region and on the face 104 of the microelectronic element 102 and then a further dielectric layer can be formed overlying the compliant layer, wherein at least portions of electrically conductive structure such as traces, bond pads, contacts, terminals, may be formed in contact with the further dielectric layer.

FIG. 14A illustrates one example in which microelectronic packages can be fabricated in accordance with an embodiment of the invention. In one example, one or more monolithic dielectric regions or molded dielectric regions 612 can be positioned on a carrier 602. In one example, the dielectric region 612 may have an area defined by its perimeter that is equal or substantially equal to that of a panel (e.g., 500 millimeters by 500 millimeters square), or which may be smaller, or larger, or have different shape. The dielectric region 612 has openings 608 defined by edge surfaces 110, the openings sized to accommodate individual microelectronic elements 102. The dielectric region 612 can be positioned relative to microelectronic elements 102 on a carrier 602 (temporary or permanent carrier) such that each microelectronic element 102 is positioned face up on the carrier 602 and within the area of one of the openings 608.

In one example, electrically conductive structure overlying the dielectric region, e.g., contacts 140, traces, and in some cases, terminals 130, can now be deposited on the monolithic dielectric region 612 or on a surface of one or more dielectric layers 120 overlying or formed on the dielectric region 612, or as otherwise provided. Alternatively, fabrication of the dielectric layer 120 and electrically conductive structure overlying the dielectric region, e.g., contacts 140, traces, and in some cases, terminals 130, can be completed prior to arranging one or more such monolithic dielectric regions with the microelectronic elements on the temporary carrier.

Thereafter, wire bonds 142 are formed extending between bond pads 106 of the microelectronic elements and corresponding contacts 140 at surfaces of the dielectric elements, and an encapsulant 604 can be formed to cover the wire bonds 142, the encapsulant extending into gaps 124 between the microelectronic element 102 and the dielectric region 612. In some cases, the encapsulant can be formed of a compliant material to permit movement of the bond wires, such as in response to force applied to the connected ends of the wire bonds, i.e., at bond pads 106 and contacts 140, under various operating or non-operating conditions of the microelectronic package.

Thereafter, the structure shown in FIG. 14A can be singulated into individual microelectronic packages 100 by severing the dielectric region 612 at boundaries 616 between them.

FIG. 14B illustrates a similar fabrication method which can be used when a dielectric layer 220 and second terminals 238 are provided at a face of the microelectronic element 202 and electrically conductive structure coupling the chip contacts 201 with the second terminals 238. In a particular embodiment, the one or more dielectric layers 220 and conductive structure can be formed prior to assembling the microelectronic element with other structure such as the dielectric element or monolithic dielectric region 612. In another example, the one or more dielectric layers 220 and conductive structure can be formed after assembling the microelectronic element with other structure such as the dielectric element or monolithic dielectric region 612. In other aspects, the method is the same as that described above relative to FIG. 14A.

Figure 15A:
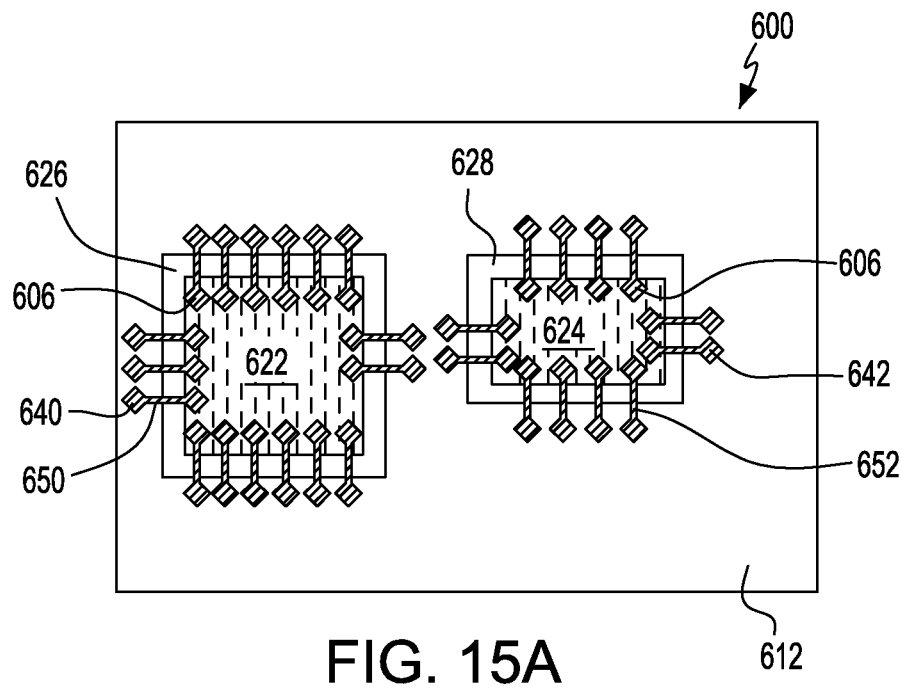
FIG. 15A is a top-down plan view depicting a microelectronic package in accordance with an embodiment of the invention.

FIG. 15A illustrates a variation of the embodiments described above relative to FIGS. 1-4 or FIGS. 5-13 in which microelectronic package 600 includes a plurality of laterally positioned microelectronic elements 622, 624, each having bond pads 606 electrically coupled with respective contacts 640, 642 and terminals (not shown) on a dielectric element through respective bond wires 650, 652. As seen in FIG. 15A, each microelectronic element is positioned within a separate area 626, 628 that is enclosed laterally by the dielectric element. In a particular example, surfaces of the bond pads 606 of the first and second microelectronic elements to which the bond wires 650, 652 are joined may be co-planar with the respective contacts 640, 642 within a tolerance of fifty microns. In a further variation, one or more additional microelectronic elements can be positioned in a similar manner within a single package.

Figure 15B:
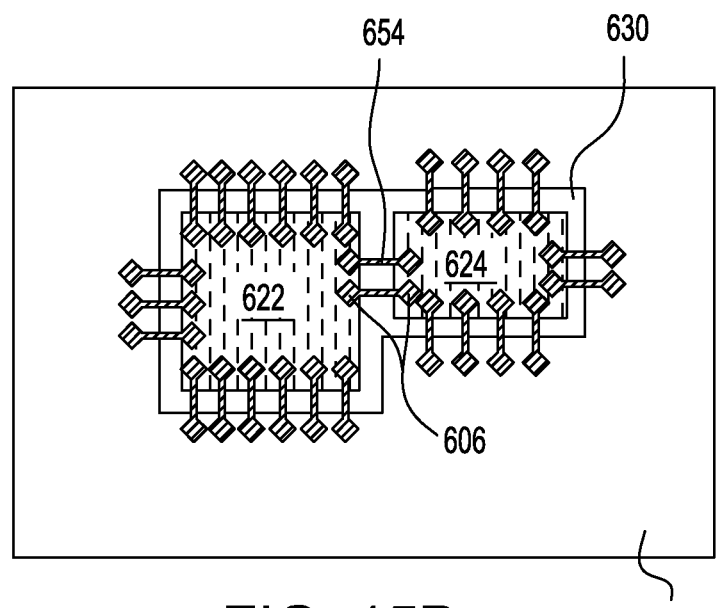
FIG. 15B is a top-down plan view depicting a microelectronic package in accordance with an embodiment of the invention.

FIG. 15B illustrates a further variation in which first and second microelectronic elements 622, 624 are positioned within a common area 630 surrounded by the dielectric element 614. In this case, at least some bond pads 606 on a first microelectronic element 622 can be electrically coupled with at least some bond pads 606 on a second microelectronic element 624 through bond wires 654 which are joined to the respective bond pads 606.

Figure 16:
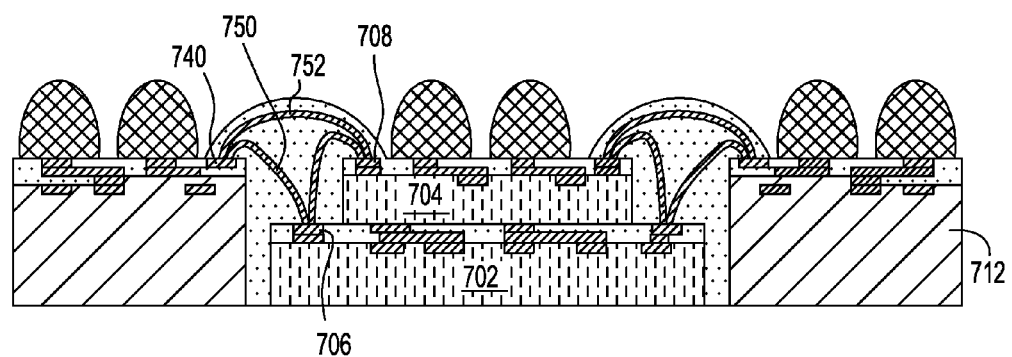
FIG. 16 is a sectional view illustrating a fan-out microelectronic package in accordance with an embodiment of the invention.

In the further variation, as depicted in FIG. 16, microelectronic element may comprise a first semiconductor chip 702 and a second semiconductor chip 704 stacked atop the first semiconductor chip, wherein the bond pads 706, 708 to which the bond wires 750, 752 extending to contacts 740 above the dielectric element 712 are joined are disposed atop at least one of the first and second semiconductor chips 702, 704. The microelectronic packages and assemblies described above with reference to FIGS. 1A through 13, and FIGS. 15-16 can be utilized in construction of diverse electronic systems, such as the system 1500 shown in FIG. 17. In specific examples and without limitation, a system may be a tablet, smartphone, other mobile device, or notebook or laptop computer or other type of processor-implemented device or computer. For example, the system 1500 in accordance with a further embodiment of the invention may include one or more microelectronic packages or assemblies as described above in conjunction with other electronic components 1508 and 1510.

Figure 17:
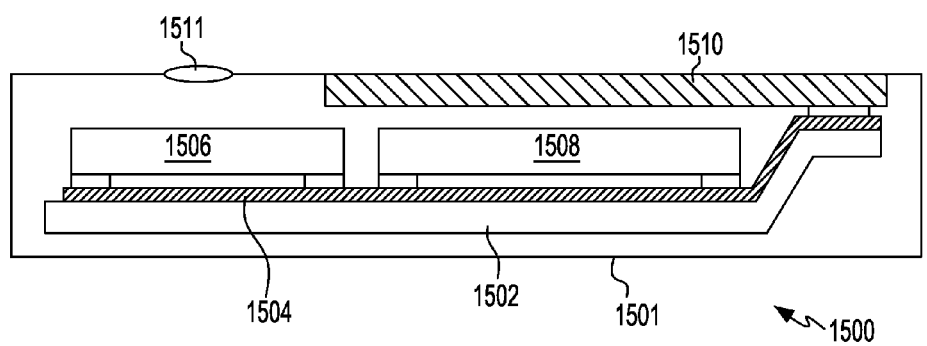
FIG. 17 depicts a system incorporating a microelectronic package in accordance with an embodiment of the invention.

In the exemplary system 1500 shown, the system can include a circuit panel, motherboard, or riser panel 1502 such as a flexible printed circuit board, and the circuit panel can include numerous conductors 1504, of which only one is depicted in FIG. 17, interconnecting the modules or components 1506 with one another. Such a circuit panel 1502 can transport signals to and from each of the microelectronic packages and/or microelectronic assemblies included in the system 1500. However, this is merely exemplary; any suitable structure for making electrical connections between the modules or components 1506 can be used.

In a particular embodiment, the system 1500 can also include another component such as the semiconductor chip 1508, and component 1510 which may be a display screen, but any other components can be used in the system 1500. Of course, although only two additional components 1508 and 1510 are depicted in FIG. 15 for clarity of illustration, the system 1500 can include any number of such components.

Modules or components 1506 and components 1508 and 1510 can be mounted in a common housing 1501, schematically depicted in broken lines, and can be electrically interconnected with one another as necessary to form the desired circuit. The housing 1501 is depicted as a portable housing of the type usable, for example, in a smartphone or cellular telephone and screen 1510 can be exposed at the surface of the housing. In embodiments where a microelectronic package 1506 includes a light-sensitive element such as an imaging chip, a lens 1511 or other optical device also can be provided for routing light to the structure. Again, the simplified system shown in FIG. 17 is merely exemplary; other systems, including systems commonly regarded as fixed structures, such as desktop computers, routers and the like can be made using the structures discussed above.

Although not specifically shown in the Figures or particularly described in the foregoing, elements in the various Figures and various described embodiments can be combined together in additional variations of the invention.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A fan-out microelectronic package, comprising:
a microelectronic element having a face defining a plane, a plurality of bond pads at the face, and a plurality of edge surfaces each extending in a direction transverse to the plane;
a dielectric element including a monolithic dielectric region of molded dielectric material or glass, the dielectric element having one or more edge surfaces each juxtaposed with or contacting a corresponding edge surface of the microelectronic element, a plurality of terminals and contacts at a major surface of the dielectric element overlying the monolithic dielectric region, each terminal configured to connect with a component external to the package, the terminals coupled with the contacts through traces supported on the dielectric element; and
a plurality of bond wires of extruded metal wire each having a first end joined with a bond pad of the plurality of bond pads and a second end joined with a contact of the plurality of contacts and crossing over the corresponding edge surfaces of the microelectronic element and the dielectric element, wherein at least some of the terminals are electrically coupled with at least some of the bond pads through the bond wires.

2. The microelectronic package as claimed in claim 1, wherein said microelectronic element comprises first and second microelectronic elements, wherein surfaces of the bond pads of the first and second microelectronic elements to which the bond wires are joined are co-planar with the respective contacts within a tolerance of fifty microns.

3. The microelectronic package as claimed in claim 1, wherein the microelectronic element comprises a first semiconductor chip and a second semiconductor chip stacked atop the first semiconductor chip, wherein the bond pads to which the bond wires are joined are disposed atop at least one of the first and second semiconductor chips.

4. The microelectronic package as claimed in claim 1, wherein the dielectric element further includes at least one dielectric layer deposited atop the monolithic dielectric region, wherein at least one of the contacts, the terminals or the traces are supported by the one or more deposited dielectric layers.

5. The microelectronic package as claimed in claim 1, wherein the dielectric element comprises a molded region contacting the at least one edge surface of the microelectronic element.

6. The microelectronic package as claimed in claim 1, wherein the dielectric element has at least one edge surface confronting the at least one edge surface of the microelectronic element with a gap between the at least one edge surface of the dielectric element and the at least one edge surface of the microelectronic element, wherein at least some of the bond wires cross over the gap.

7. The microelectronic package as claimed in claim 1, further comprising collapsible electrical connection elements provided atop the terminals, wherein a minimum height of the collapsible electrical connection elements in the collapsed state above the major surface is greater than a maximum loop height of the bond wires above the major surface.

8. The microelectronic package as claimed in claim 1, wherein the microelectronic element comprises a semiconductor chip having a surface, a plurality of chip contacts at the surface of the semiconductor chip, and a dielectric layer deposited on the surface of the semiconductor chip, wherein at least some of the bond pads are electrically coupled with the chip contacts through traces supported by the dielectric layer.

9. The microelectronic package as claimed in claim 8, further comprising second terminals at the face of the microelectronic element and supported by the dielectric layer, the second terminals configured to connect with at least one component external to the microelectronic package, at least some of the second terminals electrically coupled with the chip contacts.

10. The microelectronic package as claimed in claim 1, wherein the microelectronic element comprises a semiconductor chip having a surface, a plurality of chip contacts at the surface of the semiconductor chip, a dielectric layer deposited on the surface of the semiconductor chip, and traces supported by the dielectric layer extending from the chip contacts,
the microelectronic package further comprising second terminals at the face of the microelectronic element, at least some of the second terminals electrically coupled with the chip contacts through the traces.

11. A fan-out microelectronic package, comprising: a microelectronic element having a front face defining a plane, a rear face opposite the front face, a plurality of bond pads at the front face, and a plurality of edge surfaces each extending in a direction transverse to the plane, wherein the rear face is exposed at an exterior of the microelectronic package;
a dielectric element having one or more edge surfaces each juxtaposed with or contacting a corresponding edge surface of the microelectronic element, a plurality of terminals and a plurality of contacts at a major surface of the dielectric element electrically coupled with the terminals through traces supported on the dielectric element, the terminals configured to connect with a component external to the package; and
a plurality of bond wires of extruded metal wire each having a first end joined with a bond pad of the plurality of bond pads and a second end joined with a contact of the plurality of contacts and crossing over the corresponding edge surfaces of the microelectronic element and the dielectric element, wherein at least some of the terminals are electrically coupled with at least some of the bond pads through the bond wires.

12. The microelectronic package as claimed in claim 11, wherein the terminals comprise substantially rigid metal posts, wherein a minimum height of the metal posts above the major surface is greater than a maximum loop height of the bond wires above the major surface.

13. A method of making a fan-out microelectronic package, comprising:
forming a plurality of bond wires of extruded metal wire each joined to a bond pad at a face of a microelectronic element and to a contact at a major surface of a dielectric element, the microelectronic element and the dielectric element positioned relative to one another such that an edge surface of the dielectric element is juxtaposed with a corresponding edge surface of the microelectronic element with a gap between the juxtaposed edge surfaces, each bond wire extending across the juxtaposed edge surfaces of the microelectronic element and the dielectric element,
wherein a plurality of terminals at the major surface of the dielectric element are electrically coupled with the contacts and configured to connect with a component external to the package, at least some of the terminals are electrically coupled with the bond pads through the contacts and the bond wires, wherein the dielectric element includes a monolithic dielectric region of molded dielectric material or glass, and the plurality of terminals and contacts overlie the monolithic dielectric region.

14. The method as claimed in claim 13, wherein the dielectric element includes the monolithic dielectric region and a dielectric layer overlying the monolithic dielectric region, the method further comprising depositing the dielectric layer onto the monolithic dielectric region and then forming at least one of: at least some contacts or at least some terminals supported by the dielectric layer.

15. The method as claimed in claim 13, wherein the microelectronic element includes a semiconductor chip having a surface, a plurality of chip contacts at the surface, and a dielectric layer overlying the surface of the semiconductor chip, the method further comprising, prior to forming the bond wires, depositing the dielectric layer onto the surface of the semiconductor chip and then forming at least one of: at least some bond pads supported by the dielectric layer, or at least some traces supported by the dielectric layer, the at least some bond pads electrically coupled to the chip contacts through the traces.

16. The method as claimed in claim 15, wherein the microelectronic element comprises a semiconductor chip having a surface and a plurality of chip contacts at the surface of the chip, wherein the bond pads are electrically coupled with the contacts of the chip through metalized vias extending from the chip contacts, and traces extending from the metalized vias in a direction parallel to the surface of the semiconductor chip.

17. A method of making a fan-out microelectronic package, comprising:

introducing a flowable dielectric material into a cavity of a mold in which a microelectronic element is disposed to form a molded region contacting at least one edge surface of the microelectronic element, forming a plurality of electrically conductive contacts and electrically conductive terminals overlying a surface of the molded region;

forming a plurality of bond wires of extruded wire each joined with a bond pad of a plurality of bond pads at a face of the microelectronic element, and each bond wire joined with a contact of the plurality of contacts, wherein the terminals are configured to connect with a component external to the microelectronic package, the terminals electrically coupled with the bond pads through the contacts and the bond wires.

18. The method of claim 17, wherein the forming electrically conductive terminals and electrically conductive contacts comprises depositing at least one dielectric layer overlying the surface of the molded region, and depositing an electrically conductive material onto the at least one dielectric layer.

19. The method of claim 17, wherein the terminals are first terminals, the method further comprising forming second terminals at the face of the microelectronic element, the second terminals configured to connect with at least one component external to the microelectronic package, the second terminals electrically coupled with the bond pads.

20. The method of claim 17, wherein surfaces of the bond pads to which the bond wires are joined are co-planar within a tolerance of fifty microns with surfaces of the contacts to which the bond wires are joined.

* * * * *